United States Patent
Lin

(10) Patent No.: US 9,646,937 B2
(45) Date of Patent: May 9, 2017

(54) PACKAGING STRUCTURE FOR THIN DIE AND METHOD FOR MANUFACTURING THE SAME

(71) Applicant: DAWNING LEADING TECHNOLOGY INC., Miao-Li (TW)

(72) Inventor: Diann-Fang Lin, Miao-Li (TW)

(73) Assignee: Dawning Leading Technology Inc., Miao-Li (TW)

( * ) Notice: Subject to any disclaimer, the term of this patent is extended or adjusted under 35 U.S.C. 154(b) by 0 days.

(21) Appl. No.: 14/457,356

(22) Filed: Aug. 12, 2014

(65) Prior Publication Data
US 2015/0357288 A1   Dec. 10, 2015

(30) Foreign Application Priority Data
Jun. 5, 2014   (TW) .............................. 103119499 A

(51) Int. Cl.
*H01L 23/48*    (2006.01)
*H01L 23/00*    (2006.01)
(Continued)

(52) U.S. Cl.
CPC .......... *H01L 23/562* (2013.01); *H01L 23/552* (2013.01); *H01L 23/64* (2013.01); *H01L 23/645* (2013.01); *H01L 23/66* (2013.01); *H01L 24/92* (2013.01); *H01L 25/16* (2013.01); *H01L 23/3121* (2013.01); *H01L 24/16* (2013.01); *H01L 24/32* (2013.01); *H01L 24/33* (2013.01); *H01L 24/73* (2013.01); *H01L 2223/6677* (2013.01); *H01L 2224/04042* (2013.01); *H01L 2224/05554* (2013.01); *H01L 2224/16225* (2013.01); *H01L 2224/32225* (2013.01); *H01L 2224/33181* (2013.01); *H01L 2224/48091* (2013.01); *H01L 2224/48227* (2013.01); *H01L 2224/73215* (2013.01); *H01L 2224/73265* (2013.01); *H01L 2224/83191* (2013.01); *H01L 2224/92147* (2013.01); *H01L 2224/92165* (2013.01); *H01L 2224/92247* (2013.01); *H01L 2924/00014* (2013.01);
(Continued)

(58) Field of Classification Search
CPC ...... H01L 23/36; H01L 23/576; H01L 23/645
USPC .................................. 257/784, 724, E23.024
See application file for complete search history.

(56) References Cited

U.S. PATENT DOCUMENTS

| | | | | |
|---|---|---|---|---|
| 5,450,283 A | * | 9/1995 | Lin ........................ | H01L 21/563 174/16.3 |
| 6,444,498 B1 | * | 9/2002 | Huang .................. | H01L 21/561 257/706 |

(Continued)

*Primary Examiner* — Nitin Parekh
(74) *Attorney, Agent, or Firm* — Skaar Ulbrich Macari, P.A.

(57) ABSTRACT

A packaging structure for thin die is provided. The packaging structure has a substrate, a thin die, a strengthening layer and an encapsulation body. The thin die is disposed on and electrically connected with the substrate; the strengthening layer is disposed on the thin die; and the encapsulation body is formed on the substrate and covers both the thin die and the strengthening layer. The strengthening layer can bear pressure or stress during the formation of the encapsulation body to protect the thin die. A method for manufacturing the packaging structure for the thin die is further provided to manufacture the above packaging structure for the thin die.

6 Claims, 7 Drawing Sheets

(51) Int. Cl.
  *H01L 23/552* (2006.01)
  *H01L 23/64* (2006.01)
  *H01L 23/66* (2006.01)
  *H01L 25/16* (2006.01)
  *H01L 23/31* (2006.01)

(52) U.S. Cl.
  CPC ............. *H01L 2924/19041* (2013.01); *H01L 2924/19042* (2013.01); *H01L 2924/19043* (2013.01); *H01L 2924/19104* (2013.01); *H01L 2924/19107* (2013.01); *H01L 2924/3025* (2013.01)

(56) References Cited

U.S. PATENT DOCUMENTS

| | | | | |
|---|---|---|---|---|
| 6,458,626 B1* | 10/2002 | Huang | ................ | H01L 23/3128 257/E23.092 |
| 6,930,378 B1* | 8/2005 | St. Amand | .......... | H01L 25/0657 257/685 |
| 7,135,782 B2* | 11/2006 | Nishikawa | ............ | H01L 23/564 257/692 |
| 7,282,390 B2* | 10/2007 | Tan | ..................... | H01L 23/3128 257/724 |
| 8,664,775 B2* | 3/2014 | Sasaki | .................... | H01L 24/80 257/784 |
| 8,809,951 B2* | 8/2014 | Lin | ....................... | H01L 23/642 257/335 |
| 2003/0160312 A1* | 8/2003 | Lo | ....................... | H01L 25/0657 257/678 |
| 2004/0245652 A1* | 12/2004 | Ogata | .................... | H01L 24/03 257/777 |
| 2008/0251906 A1* | 10/2008 | Eaton | .................... | H01L 23/576 257/686 |
| 2009/0001561 A1* | 1/2009 | Chua | ....................... | H01L 23/16 257/717 |
| 2009/0096115 A1* | 4/2009 | Huang | .................. | H01L 21/565 257/796 |
| 2009/0115070 A1* | 5/2009 | Tanaka | ............. | H01L 23/49575 257/777 |
| 2009/0250805 A1* | 10/2009 | Lohr | .................. | H01L 23/3677 257/706 |
| 2010/0213590 A1* | 8/2010 | Warren | ................ | H01L 23/576 257/678 |
| 2013/0032942 A1* | 2/2013 | Sasaki | .................... | H01L 24/80 257/738 |
| 2013/0222198 A1* | 8/2013 | Kojima | .................. | H01Q 7/06 343/788 |
| 2014/0247195 A1* | 9/2014 | Yen | ......................... | H01L 23/66 343/873 |

* cited by examiner

US 9,646,937 B2

PACKAGING STRUCTURE FOR THIN DIE AND METHOD FOR MANUFACTURING THE SAME

CROSS-REFERENCES TO RELATED APPLICATIONS

This application claims priority to Taiwan Patent Application No. 103119499 filed on Jun. 5, 2014, which is hereby incorporated herein by reference in its entirety.

BACKGROUND OF THE INVENTION

Field of the Invention

The present invention provides a packaging structure and a method for manufacturing the same, and more particularly, to a packaging structure for a thin die and a method for manufacturing the same.

Descriptions of the Related Art

The packaging structure for a die functions not only to allow for easy connection of the die with a circuit board, but also to protect the die from damage by an external force and prevent degradation in the performance of the die due to moisture or dust. Additionally, some packaging structures can provide a desirable heat dissipation path for the die.

As the times evolve, electronic components on the die have become increasingly dense and the packaging structures have become increasingly complex. Furthermore, as the use of portable electronic devices and wearable electronic devices becomes more popular, there is a trend to make the dies and the packaging structures thereof miniaturized. However, reducing the thickness (i.e. thinning) of the die makes it difficult to package the thin die with conventional packaging structures because the significantly insufficient structural strength of the thin die makes the die liable to fracture during the packaging process.

For example, the die packaging process comprises a step of using an encapsulation body to encapsulate the die. In this step, the encapsulation body will press against the die during the injection molding process, causing the die to fracture under pressure. Moreover, a heating step is usually carried out after the encapsulant injection molding step to speed up the curing of the encapsulant. Unfortunately, the substrate or the encapsulant that experiences the thermal expansion or contraction tends to squeeze the die to cause damage of the die.

Accordingly, a need exists in the art to make improvement on at least one of the aforesaid shortcomings.

SUMMARY OF THE INVENTION

An objective of the present invention is to provide a packaging structure for a thin die and a method for manufacturing the same, which are intended to solve at least the technical problem that the thin die is liable to damage during the packaging process.

To achieve the aforesaid objective, the packaging structure for thin die disclosed in the present invention comprises a substrate, a thin die, a strengthening layer and an encapsulation body. The thin die is disposed on the substrate and is electrically connected with the substrate. The strengthening layer is disposed on the thin die. The encapsulation body is formed on the substrate and covers both the thin die and the strengthening layer. The strengthening layer bears a pressure or stress during the formation of the encapsulation body to protect the thin die.

To achieve the aforesaid objective, a method for manufacturing the packaging structure for the thin die disclosed in the present invention comprises the following steps: providing a substrate; disposing a thin die on the substrate and electrically connecting the thin die with the substrate; disposing a strengthening layer on the thin die; and forming an encapsulation body on the substrate and making the encapsulation body cover both the thin die and the strengthening layer. The strengthening layer bears a pressure or stress during the formation of the encapsulation body to protect the thin die.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
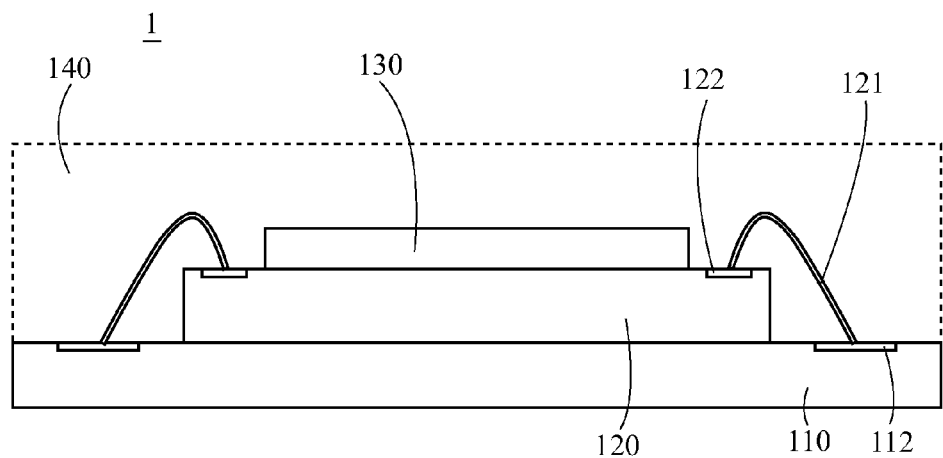
FIG. 1 is a side view of a packaging structure according to the first embodiment of the present invention.

FIG. 1 illustrates a side view of a packaging structure according to the first embodiment of the present invention. The present invention provides a packaging structure for a thin die. In the first embodiment, a packaging structure 1 comprises a substrate 110, a thin die 120, a strengthening layer 130 and an encapsulation body 140.

The thin die 120 refers to a die with a small thickness. For example, the thickness of the thin die 120 may be less than 80 μm, and is preferably less than 35 μm. The thin die 120 may be disposed on the substrate 110 and is electrically connected with the substrate 110 in a flip-chip manner or through wire bonding, although how it is electrically connected is not limited thereto. Hereinbelow, electrically connecting the thin die 120 with the substrate 110 via a bonding wire 121 will be described as an example.

The strengthening layer 130 may be disposed on the thin die 120, and in this embodiment, the width of the strengthening layer 130 is smaller than the width of the thin die 120. Therefore, after the strengthening layer 130 is disposed on the thin die 120, a part of the top surface of the thin die 120 is still exposed so that a pad 122 on the top surface of the thin die 120 is not covered by the strengthening layer 130. In this way, the pad 122 can be electrically connected with a pad 112 of the substrate 110 via the bonding wire 121.

The encapsulation body 140 is formed on the substrate 110 and covers both the thin die 120 and the strengthening layer 130.

As is known from the above descriptions, the thin die 120 has a small thickness, so the thin die 120 is relatively liable to damage correspondingly. However, the strengthening layer 130 disposed on the thin die 120 can bear or withstand an external force that would otherwise be directly applied to the thin die 120 so that the thin die 120 is not damaged. That is, the strengthening layer 130 can bear a pressure or stress during the formation of the encapsulation body 140 to protect the thin die 120.

The pressure or stress set forth herein includes the following: a molding pressure generated by molding the encapsulation body 140; or a stress generated on the surface of the thin die 120 due to a horizontal expansion or contraction stress of the encapsulation body 140 or the substrate 110 when being heated during the process of thermally curing the encapsulation body 140. Specifically, the latter situation entails the following: in a heating step carried out after molding the encapsulation body 140, the times needed for different portions of the encapsulation body 140 to be cured are not exactly the same, so the different portions of the thin die 120 are subjected to different external forces correspondingly; or in the heating step and subsequent cooling step, a horizontal expansion or contraction stress is generated due to the difference in coefficient of thermal expansion (CTE) between the substrate 110 and the thin die 120.

To make the strengthening layer 130 capable of bearing the aforesaid pressure or stress, the structural strength of the strengthening layer 130 is better. Preferably, the strengthening layer 130 may include a soft-board material (e.g., polyimide), a hard-board material (e.g., resin), a thermosetting material, a material containing silicon or a dummy die.

In this embodiment, the strengthening layer 130 is made of a thermosetting material. The thermosetting material can be directly coated on the thin die 120 after being heated, and is then cured to form the strengthening layer 130. Therefore, the need for an adhesive material between the strengthening layer 130 and the thin die 120 is eliminated, which further reduces the thickness of the packaging structure 1.

On the other hand, the strengthening layer 130 may also be thinned to make the thickness of the thin die 120 larger than the thickness of the strengthening layer 130, and this will further reduce the thickness of the whole packaging structure 1. Furthermore, the material of the strengthening layer 130 may be selected depending on the target thickness of the packaging structure 1. For example, when the target thickness of the packaging structure 1 is relatively small, a material with a high structural strength is selected for the strengthening layer 130 so that the thin strengthening layer 130 is still strong enough to protect the thin die 120.

Figure 2A:
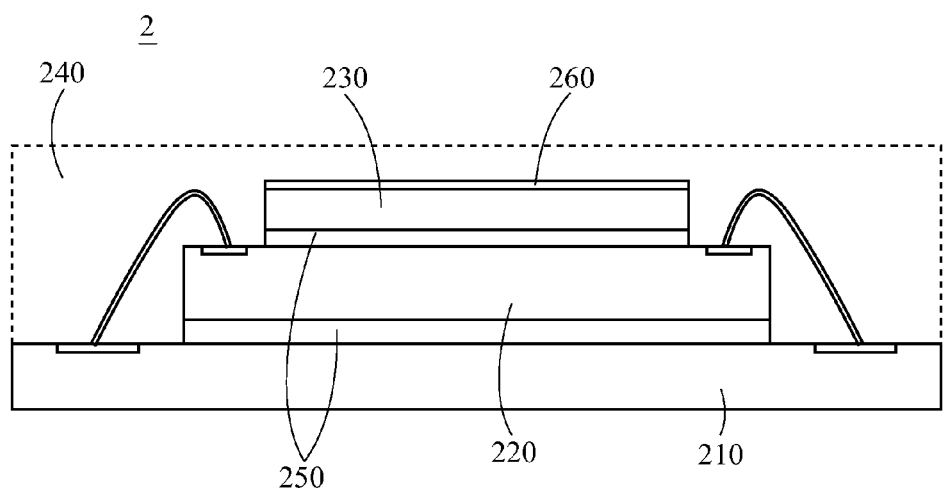
FIG. 2A is a side view of a packaging structure according to the second embodiment of the present invention.
Figure 2B:
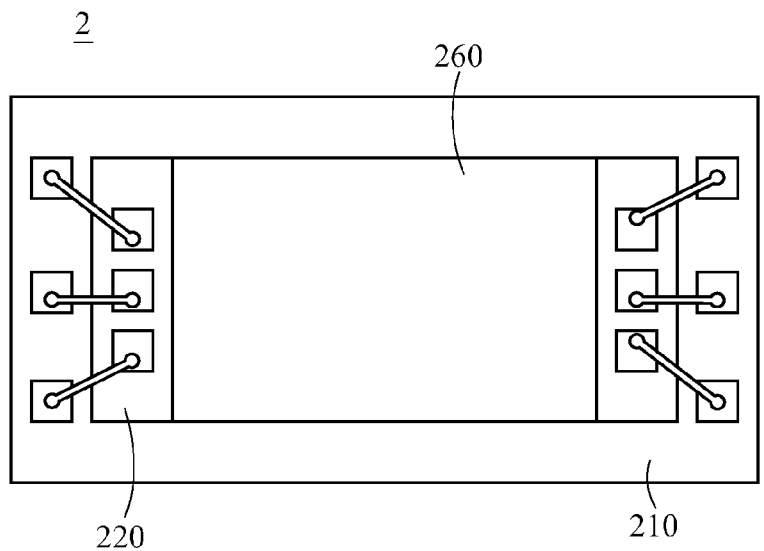
FIG. 2B is a top view of the packaging structure according to the second embodiment of the present invention.

FIGS. 2A and 2B show a side view and a top view of a packaging structure according to the second embodiment of the present invention. The packaging structure 2 of the second embodiment has technical features similar to the packaging structure 1 (for example, also comprising a substrate 210, a thin die 220, a strengthening layer 230 and an encapsulation body 240), but differs therefrom at least in that: the packaging structure 2 further comprises an adhesive layer 250 disposed between the strengthening layer 230 and the thin die 220 to stick the strengthening layer 230 on the thin die 220.

Specifically, when the strengthening layer 230 is made of a non-thermosetting material (e.g., a dummy die), it is not easy to directly fix the strengthening layer 230 on the thin die 220. However, the adhesive layer 250 can help to fix the strengthening layer 230 on the thin die 220. The adhesive layer 250 can also help to stick the thin die 220 on the substrate 210.

The packaging structure 2 differs from the packaging structure 1 also in that: the packaging structure 2 further comprises a metal layer 260 disposed on the strengthening layer 230. The metal layer 260 may be disposed on the whole top surface of the strengthening layer 230 as a shielding structure. That is, the metal layer 260 may provide a shielding effect so that operations of the thin die 220 are not liable to influences from variations of an external electric field.

Figure 2C:
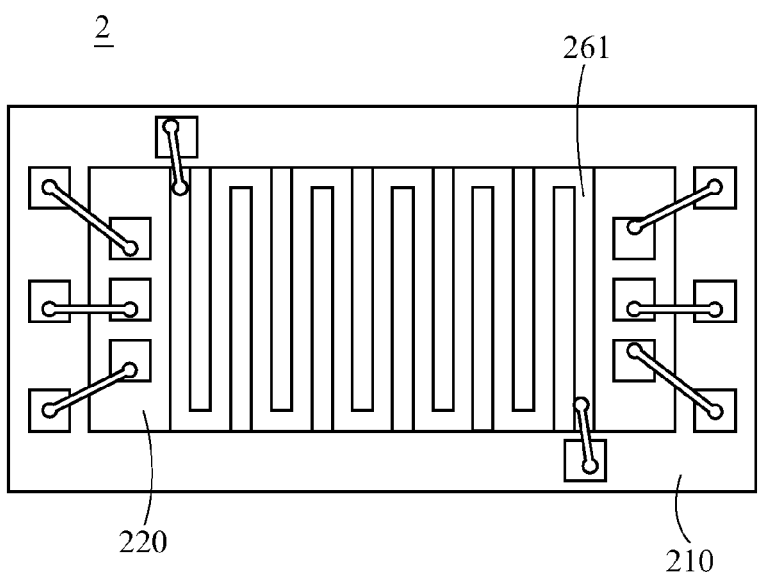
FIG. 2C is another top view of the packaging structure according to the second embodiment of the present invention.

As shown in FIG. 2C, there is shown another top view of the packaging structure according to the second embodiment of the present invention. The metal layer 260 may also be disposed on a part of the top surface of the strengthening layer 230, that is, the metal layer 260 may have a patterned structure 261 to form an inductor or an antenna. The metal layer 260 formed with the inductor or the antenna may be electrically connected with the thin die 220 (e.g., connected to the thin die 220 via the substrate 210) so that the inductor or the antenna of the metal layer 260 can be used by the thin die 220.

Figure 3A:
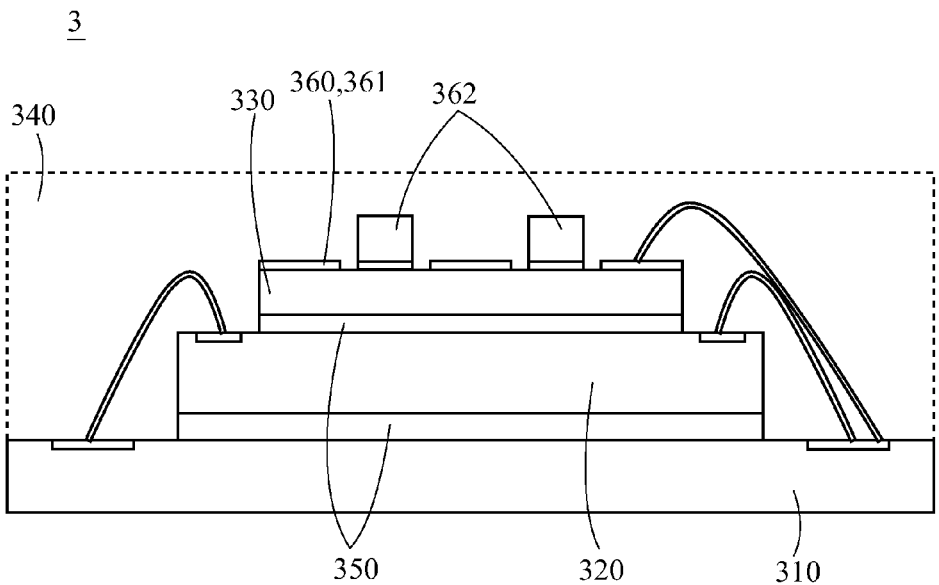
FIG. 3A is a side view of a packaging structure according to the third embodiment of the present invention.
Figure 3B:
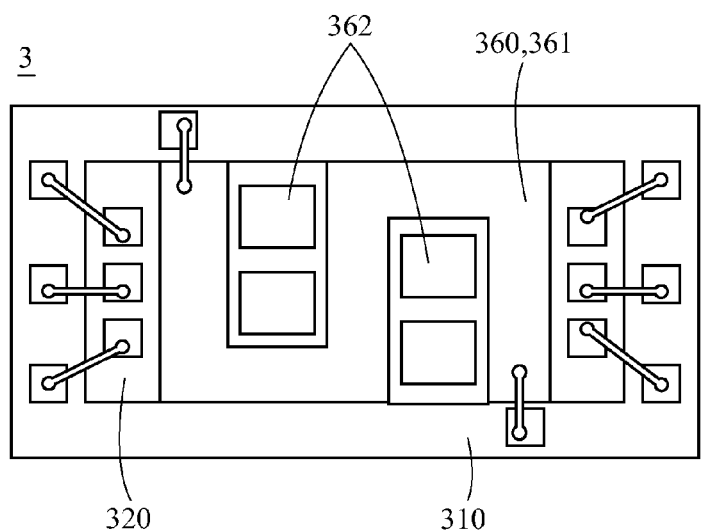
FIG. 3B is a top view of the packaging structure according to the third embodiment of the present invention.

FIGS. 3A and 3B show the side view and top view of a packaging structure according to the third embodiment of the present invention. The packaging structure 3 of the third embodiment has technical features similar to the packaging structure 2, for example, also comprising a substrate 310, a thin die 320, a strengthening layer 330, an encapsulation body 340, an adhesive layer 350 and a metal layer 360. Similarly, the metal layer 360 may also have a patterned structure 361.

The packaging structure 3 differs from the packaging structure 2 at least in that: the metal layer 360 is disposed on a part of the strengthening layer 330 so that the top surface of the strengthening layer 330 is partly exposed. The packaging structure 3 further comprises at least one passive component 362 (e.g., a resistor, a capacitor and etc.). The passive component 362 is disposed on the part of the strengthening layer 330 that is not covered by the metal layer 360. The passive component 362 is electrically connected with the thin die 320 (e.g., through wire bonding or via the strengthening layer 330). In this way, the passive component 362 can be used by the thin die 320 to achieve a specific function.

Figure 4A:
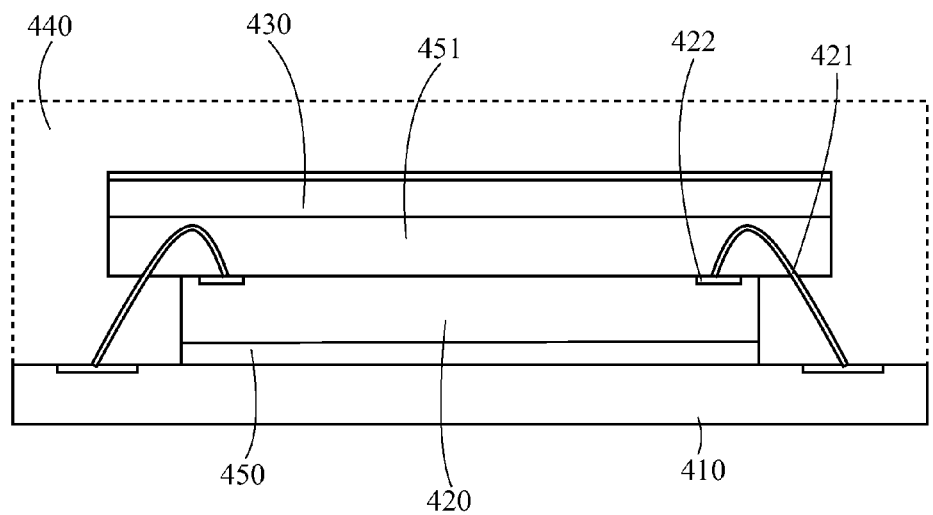
FIG. 4A is a side view of a packaging structure according to the fourth embodiment of the present invention.
Figure 4B:
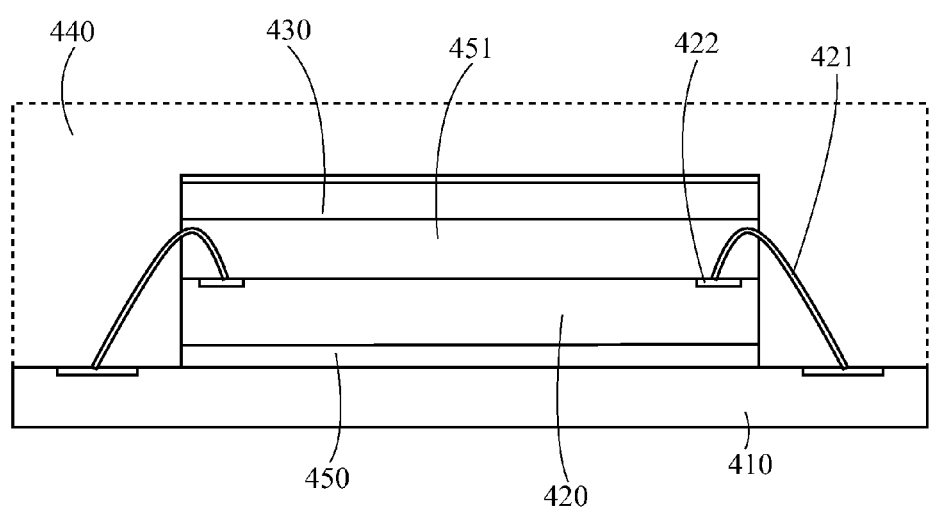
FIG. 4B is a side view of the packaging structure according to the fourth embodiment of the present invention.

FIGS. 4A and 4B show two side views of a packaging structure according to the fourth embodiment of the present invention. The packaging structure 4 of the fourth embodiment has technical features similar to the packaging structure 2 (for example, also comprising a substrate 410, a thin die 420, a strengthening layer 430, an encapsulation body 440 and an adhesive layer 450), but differs therefrom in that a material of the adhesive layer 450 is a Film over Wire 451 (FOW).

The FOW 451 has a high fluidity before being cured, so when the FOW 451 is coated on the thin die 420 with a bonding wire 421 disposed thereon, or when the strengthening layer 430 coated with the FOW 451 is covered on the thin die 420 with the bonding wire 421 disposed thereon, the bonding wire 421 will not be distorted by pressure or be detached from the pad 422.

In other words, the strengthening layer 440 can cover a part of the wire 421 through the adhesion provided by the FOW 451. Then, even when the width of the strengthening layer 430 is equal to or larger than the width of the thin die 420 as shown in FIG. 4A (where the width of the strengthening layer 430 is larger than the width of the thin die 420) and in FIG. 4B (where the width of the strengthening layer 430 is equal to the width of the thin die 420), the strengthening layer 430 can still be disposed on the thin die 420.

The above paragraphs have described the packaging structures 1-4 according to four embodiments of the present invention. As can be known from the above paragraphs, by means of the strengthening layers 130-430, the packaging structures 1-4 can effectively prevent the molding pressures of the encapsulation bodies 140-440 and the expansion or contraction stresses of the encapsulation bodies generated when the encapsulation bodies are cured from being directly applied to the thin dies 120-420, thus making the thin dies 120-420 less liable to damage during the packaging process.

Figure 5A:
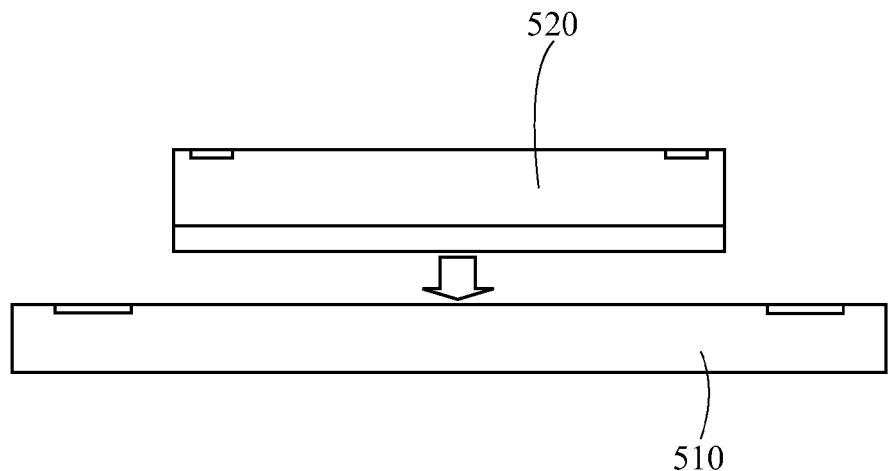
FIG. 5A is a schematic view illustrating the step of a method for manufacturing a packaging structure according to the fifth embodiment of the present invention.
Figure 5B:
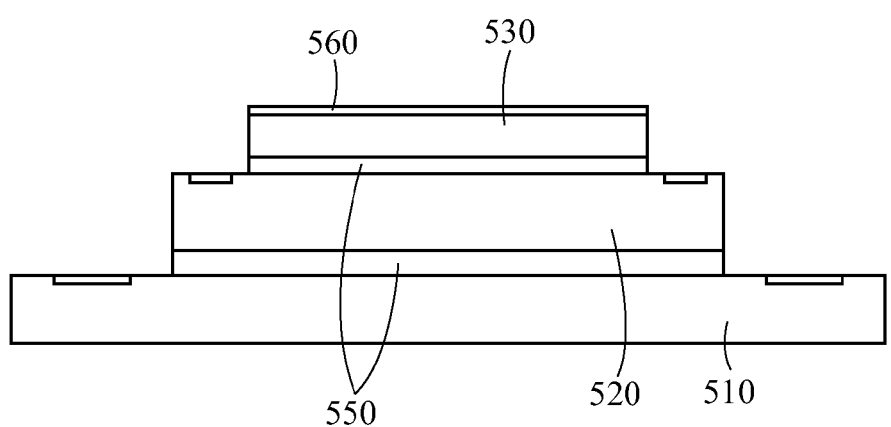
FIG. 5B is a schematic view illustrating a step of the method for manufacturing the packaging structure according to the fifth embodiment of the present invention.
Figure 5C:
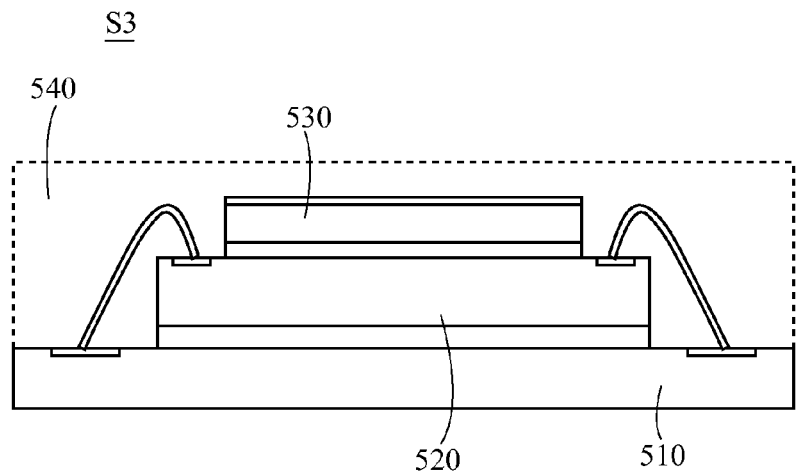
FIG. 5C is a schematic view illustrating a step of the method for manufacturing the packaging structure according to the fifth embodiment of the present invention.

FIGS. 5A-FIG. 5C illustrate two schematic views for the steps of a method for manufacturing a packaging structure for a thin die according to the fifth embodiment of the present invention. In the fifth embodiment, a method for manufacturing a packaging structure (hereinbelow called "the manufacturing method" for short) is provided. The manufacturing method can be used to manufacture, for example, the aforesaid packaging structures 1-4, so for the technical content of the manufacturing method, reference may be made to the technical contents of the packaging structures 1-4. Furthermore, in the following steps, the sequence of the steps may be altered without being limited to what has been described herein. The manufacturing method may comprise the following steps.

In step S1, a substrate 510 is provided, and then a thin die 520 is disposed on the substrate 510. Next, in step S2, a strengthening layer 530 is disposed on the thin die 520. Finally, in step S3, an encapsulation body 540 is formed on the substrate 510 to cover both the thin die 520 and the strengthening layer 530.

Hereinbelow, the steps will be detailed.

First, in step S1, a substrate 510 is provided, and then a thin die 520 is disposed on the substrate 510 and is electrically connected with the substrate 510. The thin die 520 may be electrically connected with the substrate 510 after being disposed on the substrate 510 or while being disposed on the substrate 510. However, if the thin die 520 needs to be connected with the substrate 510 through wire bonding, the step is preferably carried out after the strengthening layer 530 is disposed on the thin die 510 (i.e., after the step S2) and before the encapsulation body 540 is formed on the substrate 510 (i.e., before the step S3).

In step S2, the strengthening layer 530 is disposed on the thin die 520. To dispose the strengthening layer 530 on the thin die 520, an adhesive layer 550 may be stuck on a surface of the strengthening layer 530 and then the surface is attached to the thin die 520 to stick the adhesive layer 550 on the thin die 520. Of course, the same objective may also be achieved by firstly coating the adhesive layer 550 on the surface of the thin die 520 and then disposing the strengthening layer 530 on the surface. However, if the strengthening layer 530 is made of a thermosetting material, coating the adhesive layer 550 may be omitted from step S2.

Furthermore, in step S2, after the strengthening layer 530 is disposed on the thin die 520, a metal layer 560 may further be disposed on the strengthening layer 530, and the metal layer 560 may be fixed to the strengthening layer 530 by electroplating or soldering or by means of an adhesive. In this embodiment, sticking the metal layer 560 to the thin die 520 by means of the adhesive layer 550 is described as an example. However, the metal layer 560 may be firstly formed into a patterned structure 561 before the metal layer 560 is disposed on the strengthening layer 530. The patterned structure 561 may form an inductor or an antenna.

Finally, in step S3, an encapsulation body 540 is formed on the substrate 510 to cover both the thin die 520 and the strengthening layer 530. While the encapsulation body 540 is being formed, the strengthening layer 530 bears a pressure or stress from the formation of the encapsulation body 540 to protect the thin die 520. The pressure or stress includes the following situations: a molding pressure generated by molding the encapsulation body 540, or a horizontal expansion or contraction stress of the encapsulation body 540 or the substrate 510 generated by thermally curing the encapsulation body 540.

Figure 5D:
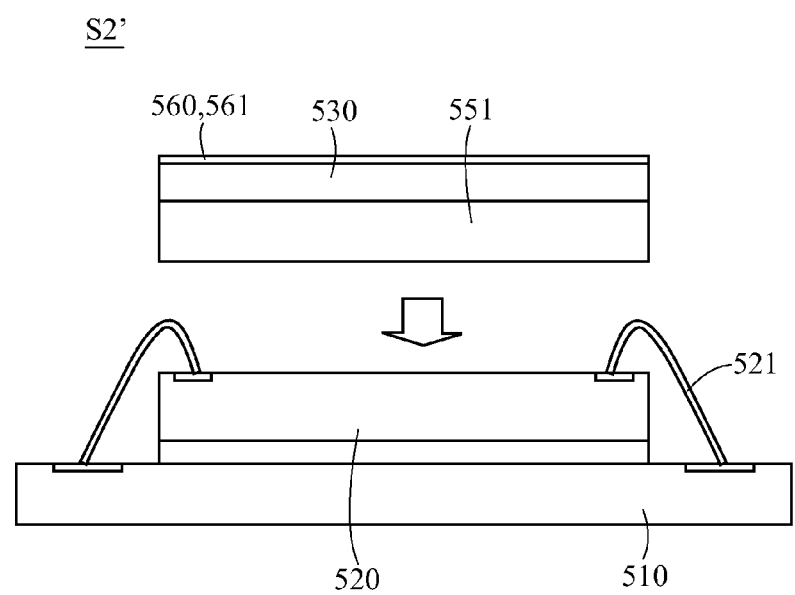
FIG. 5D is a schematic view illustrating a step of the method for manufacturing the packaging structure according to the fifth embodiment of the present invention.

Furthermore, with reference to FIG. 5D, if the material of the adhesive layer 550 is a FOW 551 in other embodiments, step S2' will be carried out after step S1 to dispose the strengthening layer 530 coated with the FOW 551 onto the thin die 520 so that the strengthening layer 530 and the FOW 551 cover on the thin die 520 and a part of the bonding wire 521.

Figure 5E:
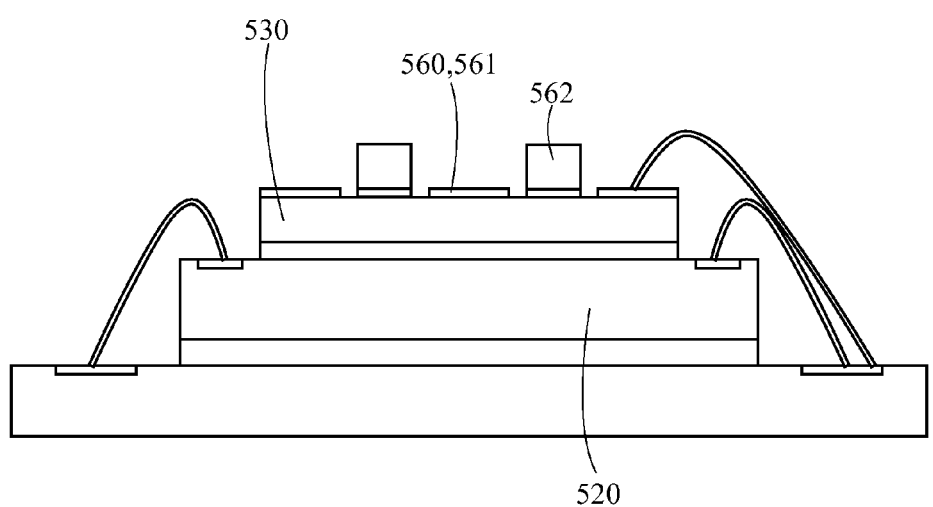
FIG. 5E is a schematic view illustrating a step of the method for manufacturing the packaging structure according to the fifth embodiment of the present invention.

In other embodiments, with reference to FIG. 5E, the manufacturing method may further comprise a substep S2-1 between step S2 and step S3 (or between step S2' and step S3). In substep S2-1, at least one passive component 562 is disposed on the strengthening layer 530 with the passive component 562 that is separated from the metal layer 560. In the implementation comprising the substep S2-1, the metal layer 560 is disposed on a part of the strengthening layer 530 so that the top surface of the strengthening layer 530 is partly exposed.

The substep S2-1 further comprises the step of electrically connecting the passive component 562 with the thin die 520, and this may be accomplished while the passive component 562 is disposed on the strengthening layer 530 or after the passive component 562 has been disposed on the strengthening layer 530.

According to the above descriptions, the packaging structure for thin die and the method for manufacturing the same disclosed in the embodiments of the present invention have the following features: the strengthening layer bears the pressure or stress during the formation of the encapsulation body to protect the thin die to prevent damage to the thin die during the packaging process.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:
1. A packaging structure for thin die, comprising:
a substrate;

a thin die, disposed on and electrically connected with the substrate;

a strengthening layer, made of a thermosetting material and disposed directly on a top surface of the thin die; and an encapsulation body, formed on the substrate and covering both the thin die and the strengthening layer, wherein an entire top surface of the strengthening layer directly contacts the encapsulation body;

wherein the strengthening layer bears a pressure or stress during a formation of the encapsulation body to protect the thin die;

wherein a width of the strengthening layer is smaller than a width of the thin die, so that a pad on the top surface of the thin die is exposed from the strengthening layer so that it is electrically connected with a pad of the substrate via a bonding wire;

wherein no adhesive material is disposed between the strengthening layer and the thin die.

2. The packaging structure according to claim 1, wherein the pressure or stress includes: a molding pressure generated by molding the encapsulation body; or a horizontal expansion or contraction stress of the encapsulation body or the substrate generated by thermally curing the encapsulation body.

3. The packaging structure according to claim 1, wherein a thickness of the thin die is less than 80 μm.

4. The packaging structure according to claim 3, wherein the thickness of the thin die is less than 45 μm.

5. The packaging structure according to claim 1, wherein a thickness of the thin die is larger than a thickness of the strengthening layer.

6. The packaging structure according to claim 1, wherein the thin die is electrically connected with the substrate through wire bonding.

* * * * *